United States Patent [19]
Toda

[11] Patent Number: 5,010,518
[45] Date of Patent: Apr. 23, 1991

[54] SEMICONDUCTOR MEMORY DEVICE
[75] Inventor: Haruki Toda, Yokohama, Japan
[73] Assignee: Kabushiki Kaisha Toshiba, Kawasaki, Japan
[21] Appl. No.: 422,051
[22] Filed: Oct. 16, 1989
[30] Foreign Application Priority Data
  Oct. 19, 1988 [JP] Japan .................................. 63-263153
[51] Int. Cl.$^5$ ........................................... G11C 11/34
[52] U.S. Cl. ................................... 365/145; 365/210; 365/149
[58] Field of Search .............. 365/210, 145, 149, 117, 365/189.09

[56] References Cited
U.S. PATENT DOCUMENTS
4,873,664 10/1989 Eaton, Jr. ........................... 365/145

OTHER PUBLICATIONS
"A New Memory Technology Is About to Hit The Market", Electronics, pp. 91-95, Feb. 18, 1988.
Evans, et al., "An Experimental 512-bit Nonvolatile Memory with Ferroelectric Storage Cell", IEEE Journal of Solid-State Circuits, vol. 23, No. 5, pp. 1171-1175, Oct. 1988.

Primary Examiner—Joseph A. Popek
Attorney, Agent, or Firm—Finnegan, Henderson, Farabow, Garrett and Dunner

[57] ABSTRACT

A semiconductor memory device comprises a first bit line, a second bit line paired with the first bit line, a third bit line branch-connected with the first bit line, a fourth bit line paired with the third bit line and branch-connected with the second bit line, a memory cell array connected to the bit lines, a first reference cell, and a second reference cell. The first reference cell is connected to the first bit line and the third bit line, constituted by a cell which is formed of substantially the same area, capacity and structure as the memory cell array, and providing a reference potential at the time of reading out data from memory cells in the memory cell array. And the second reference cell is connected to the second bit line and the fourth bit line, constituted by a cell which is formed of substantially the same area, capacity and structure as the memory cell array, and providing a reference potential at the time of reading out data from the memory cells in the memory cell array. The memory cell array is a non-volatile type constituted by ferroelectric cells.

17 Claims, 15 Drawing Sheets

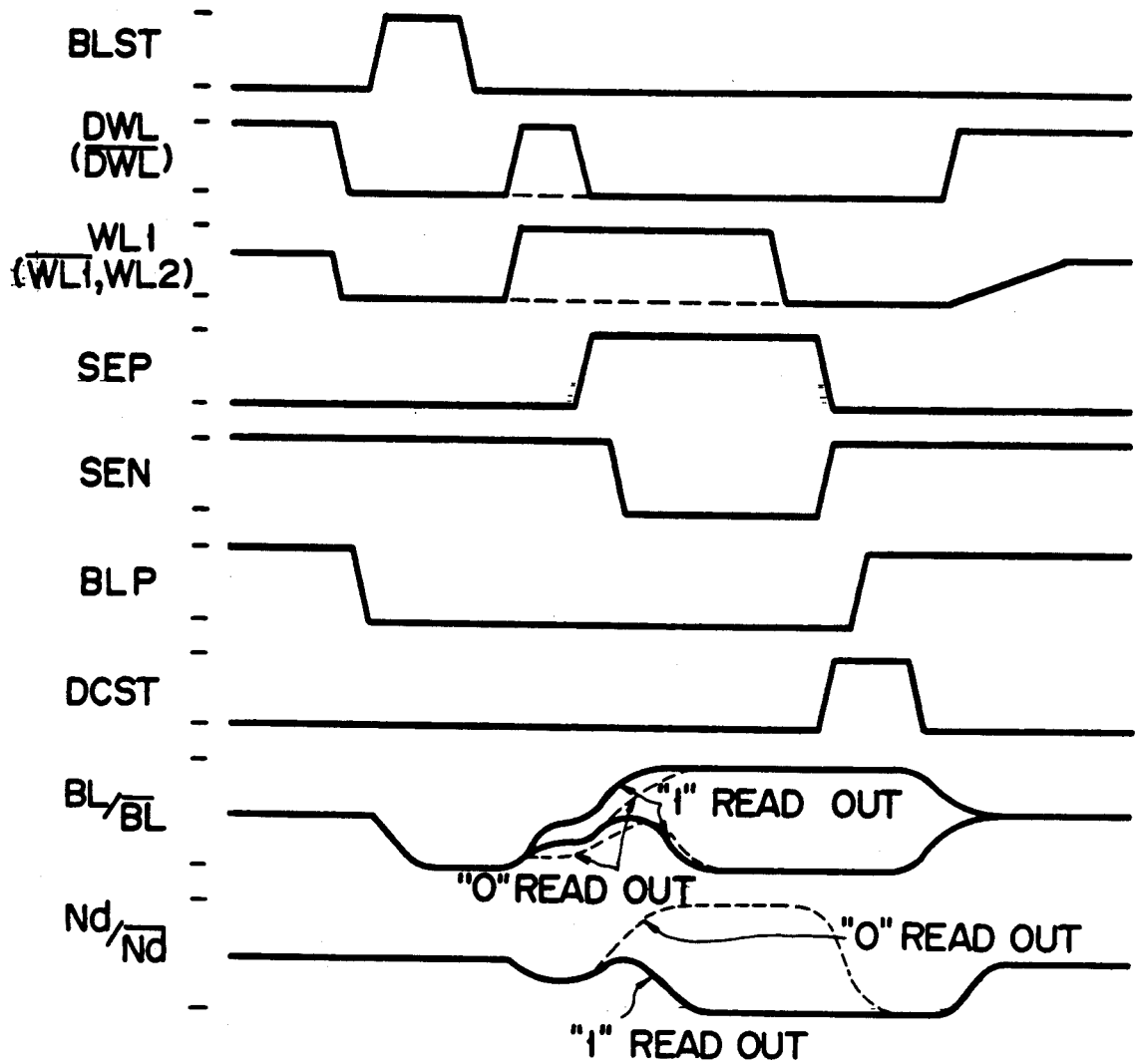
F I G. 3

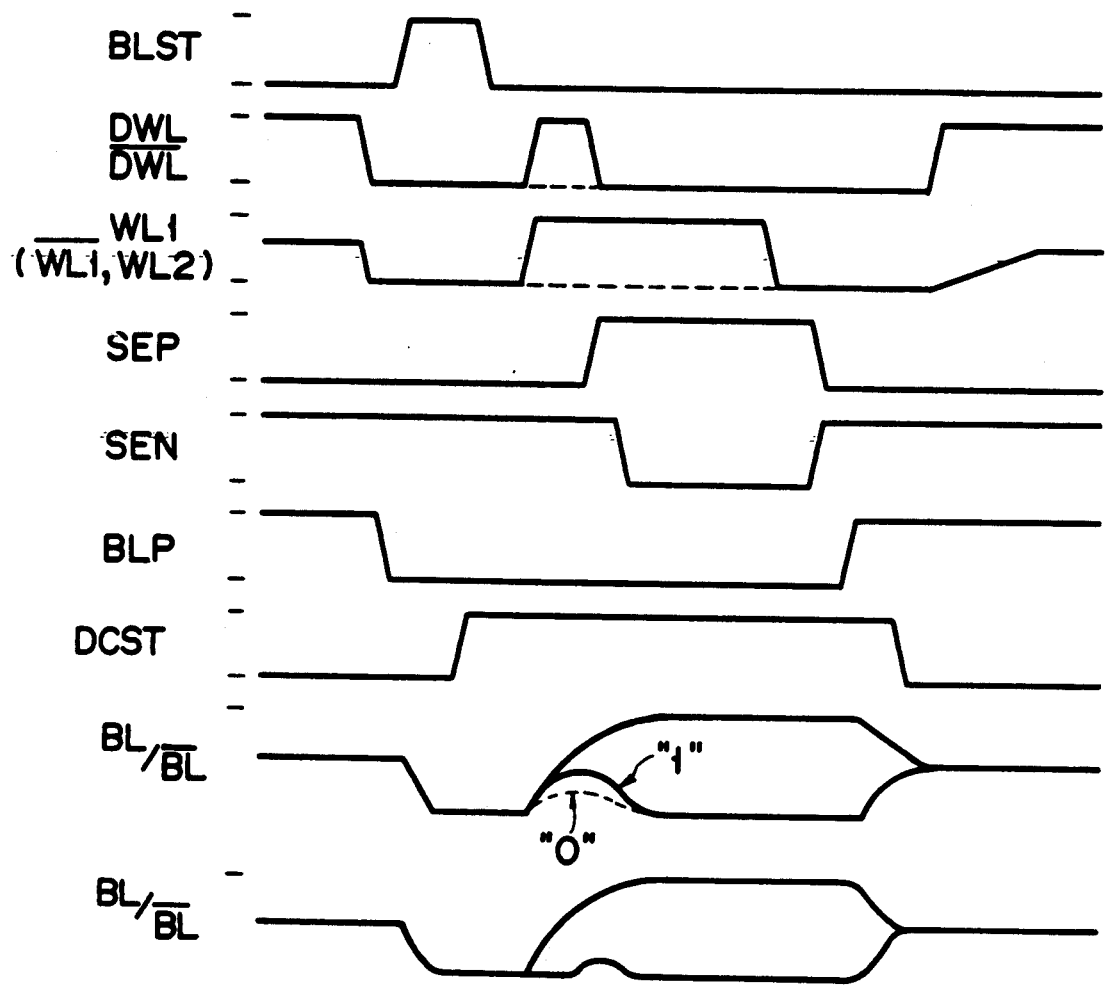
F I G. 4

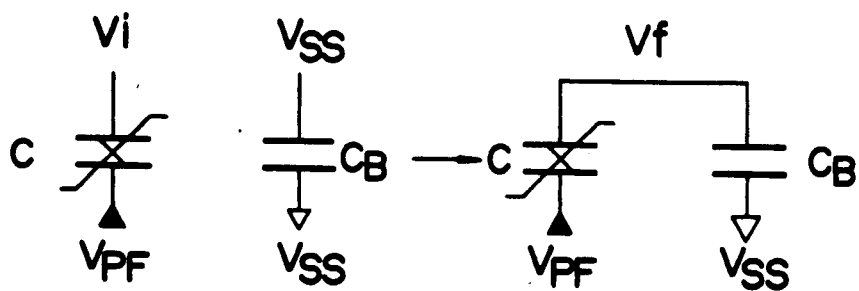
F I G. 10A
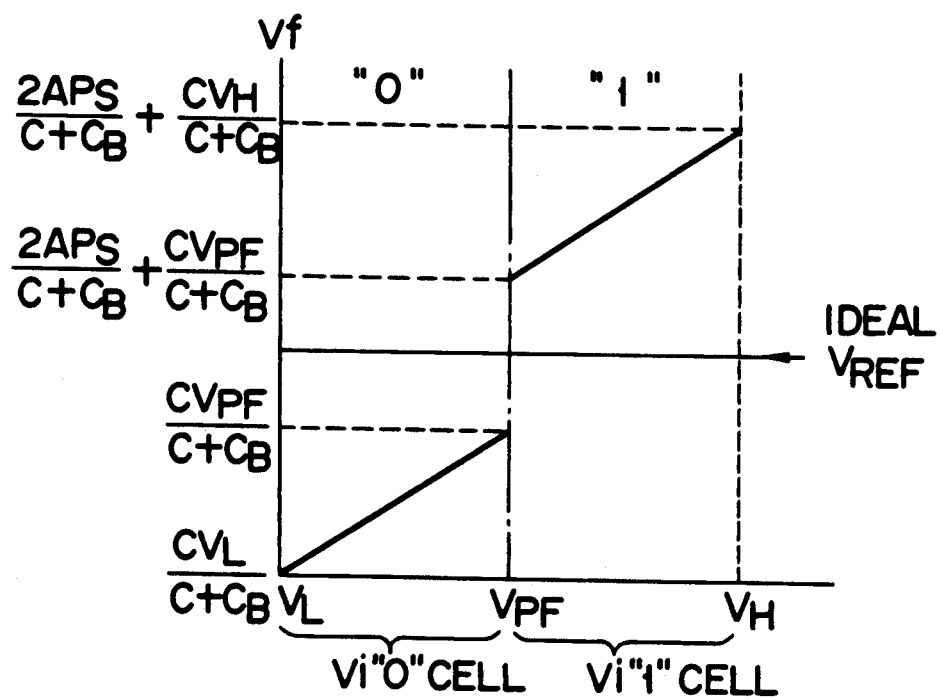
F I G. 10B

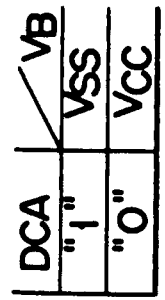
F I G. 11A
F I G. 11B

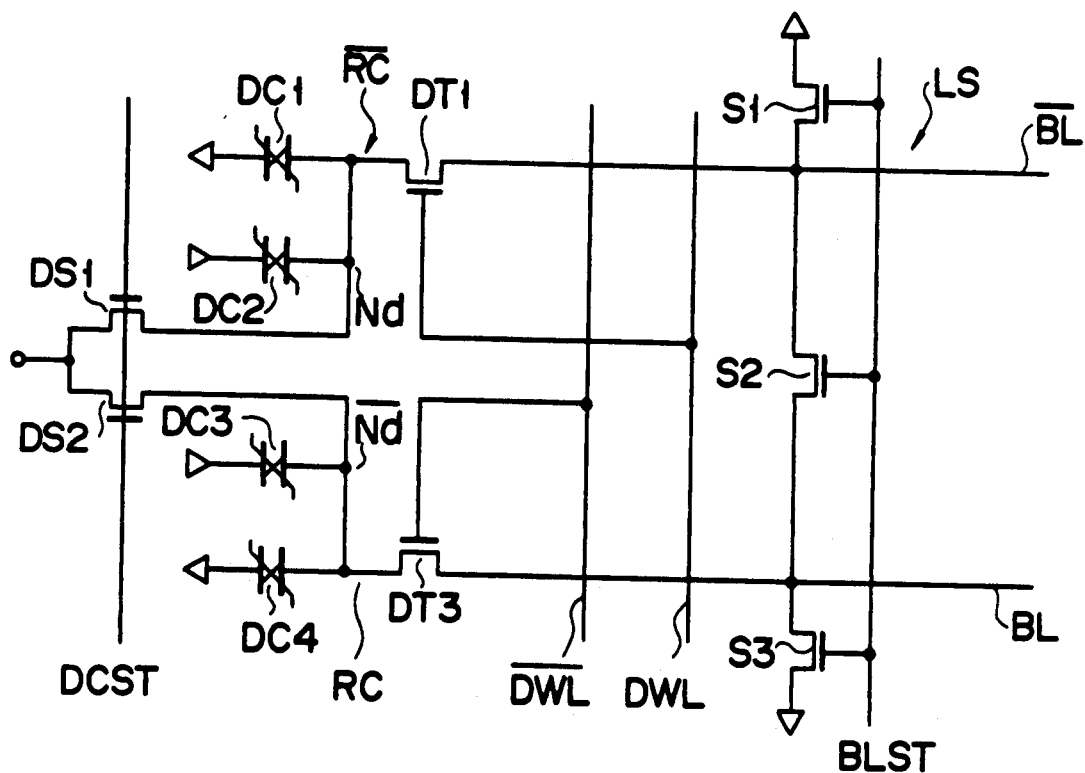
F I G. 15

SEMICONDUCTOR MEMORY DEVICE

BACKGROUND OF THE INVENTION

1. Field of the Invention

The present invention relates to a cell data sense circuit for a non-volatile semiconductor memory using a ferroelectric cell and requiring no refresh operation, and, in particular, to a semiconductor memory employed, for example, as a semiconductor disc substituted for a magnetic disc, or a buffer memory of image data for image processing.

2. Description of the Related Art

As shown in FIG. 16, a conventional DRAM (dynamic random-access memory) employs a memory cell comprising a capacitor C1 for retaining information and a MOS transistor T1 for charge transfer. In this memory cell, a predetermined cell plate voltage Vp is applied to one end of the capacitor C1. When the potential on a word line WL is set to a high level and the MOS transistor T1 is turned on, electric charge flows into the capacitor C1 from a bit line BL through the MOS transistor T1. When the potential on the word line WL is set to a low level and the MOS transistor T1 is turned off, the charge (data) is retained in the capacitor C1.

As described above, since the DRAM has a simple cell structure, the cell area is small. Thus, as a high-density memory element, the DRAM is the most popular of all types of semiconductor memories. However, the DRAM has a disadvantage. Namely, since data is retained by cell charge stored in the capacitor, there is a concern that the charge is lost because of a sub-threshold leak in the charge transfer transistor. As is well known, in order to retain cell data, a refresh operation is repeated at a predetermined interval to supply charge.

Though high-speed write/read operation can be performed in the DRAM, the DRAM is a so-called volatile semiconductor memory wherein a refresh operation is not carried out once the power is turned off, and the stored data is lost. Under the circumstances, a study has been made of a RAM having the same high-density as a DRAM, being subjected to high-speed read/write operation, and being free from the need for the refresh operation or volatility at the time of turning-off. In particular, a ferroelectric cell has been proposed as a non-volatile memory element in which data can be easily rewritten (Electronics/Feb. 4, 1988, p. 32: Electronics/Feb. 18, 1988, pp. 91-95). In this ferroelectric cell, the spontaneous polarization characteristic of a ferroelectric body (lead zirconium titanate) is utilized to retain data.

In general, the ferroelectric cell is applied to a RAM such that an additional element is provided in a SRAM cell. Thus, the area of a cell is not decreased. Even if a structure similar to that of a DRAM cell is employed, two cells are needed for one bit, and a read operation of cell data is complex.

In the above-described conventional method of applying a ferroelectric cell to the RAM, the area of the cell becomes large and the read operation of cell data is complex. Under the circumstances, there is proposed a non-volatile semiconductor memory in which the ferroelectric cell can be used where a refresh operation is not required. This semiconductor memory can be realized without using unconventional DRAM circuit design techniques or process techniques.

This proposed semiconductor memory has a sense amplifier system for detecting and amplifying a potential variation in paired bit lines which is caused by the operation of a memory cell. In this memory cell, a ferroelectric body is interposed between the electrodes of a capacitor. The potential of one electrode of the ferroelectric capacitor is set to an intermediate level between potentials corresponding to logical "1" and "0" levels of the bit lines. A charge transfer transistor is connected between the other electrode of the ferroelectric capacitor and the bit lines. Where the maximum distance between the electrodes of the ferroelectric capacitor is represented by d (cm) and the intensity of a electric field needed for inverting the spontaneous polarization of the ferroelectric body and stabilizing the inverted polarization is represented by Et (v/cm), the value of Et×d is smaller than half the value of the potential difference between the logical "1" and "0" levels of the bit lines.

Until the access to cell data is started, the paired bit lines are equalized to a level substantially equal to the potential level of a cell plate. After the access is started and just before the charge transfer transistor of the memory cell and a charge transfer transistor for the reference cell are turned on, the potentials of the paired bit lines are set to a level near one of the two levels of power source potentials Vcc and Vss. Thereafter, the charge transfer transistor of the memory cell and the charge transfer transistor for the reference cell, connected to a bit line paired with the bit line connected to the memory cell, are turned on. One of the bit lines is supplied with a reference level potential by the reference cell, and the other is supplied with a data level potential by the data from the memory cell. Then, as in a conventional DRAM, the potential levels of the paired bit lines are sense-amplified.

Hereinafter, the above semiconductor memory will be described in detail with reference to the accompanying drawings. FIG. 5 shows a semiconductor memory having a sense amplifier system for detecting and amplifying a potential variation in paired bit lines due to the operation of a memory cell. Namely, FIG. 5 shows a portion (corresponding to one column of a matrix-shaped memory cell array) of a memory employing a reference cell and a memory cell having a ferroelectric capacitor in a cell data sense system of a conventional DRAM.

Symbols $\overline{BL}$ and BL denote a pair of bit lines. Memory cells MC1 and MC3 are connected to the bit line BL, and memory cells MC2 and MC4 are connected to the bit line $\overline{BL}$. Word lines WL1 and WL2 are connected to the gates of charge transfer transistors T1 and T3 of memory cells connected to the bit line BL. Word lines $\overline{WL1}$ and $\overline{WL2}$ are connected to the gates of charge transfer transistors T2 and T4 of the memory cells connected to the bit line $\overline{BL}$. A reference level generating circuit REF supplies a reference level corresponding to a memory cell readout level to the bit lines. Symbol PR indicates a bit line precharge circuit, symbol SA indicates a sense amplifier for detecting and amplifying a potential variation in the bit lines, symbols DQ and $\overline{DQ}$ denote a pair of data lines, and symbols G1 and G2 denote bit line selection transistors connected between the bit lines and the data lines and switched by a column selection signal CSL.

As shown in FIGS. 6A and 6B, each of the memory cells MC1 to MC4 has a structure wherein a ferroelectric body 20 is interposed between capacitor electrodes 21 and 22 formed of a conductor, such as metal. Each of the memory cells MC1 to MC4 comprises a ferroelectric capacitor CF, a potential VPF of one of the electrodes which is set to (VH+VL)/2 or an intermediate level. Potential VH corresponds to logical "1" level of the bit line and potential level VL corresponds to logical "0" level of the bit line. Charge transfer transistor TF is connected between the other electrode of the ferroelectric capacitor CF and the bit line BL (or $\overline{BL}$) and has its gate connected to the word line WL. A maximum distance d (cm) between the electrodes of the ferroelectric capacitor CF is less than a predetermined value, as described later.

The reference level generating circuit REF is constituted by a reference cell comprising two reference ferroelectric capacitors having substantially half the area and half the capacity of the ferroelectric capacitor CF of each of memory cells MC1 to MC4, and two charge transfer transistors each connected between the two reference ferroelectric capacitors and one bit line.

FIG. 8 is a graph showing the characteristic of the ferroelectric body. The abscissa of the graph indicates the value $E(V/cm) = V(V)/d$ (cm), in the case where an external electric field or a voltage V(V) is applied to the ferroelectric body, i.e., between the electrodes 21 and 22 of the ferroelectric capacitor. The ordinate of the graph indicates spontaneous polarization P. The relationship between P and E of the ferroelectric body is a hysteresis relationship.

Suppose that an electric field is applied to the ferroelectric body in which domains of polarization are non-uniform and polarization does not occur as a whole. When the electric field E is increased in the positive direction, the degree of polarization increases from point 0 to point A. At the point A, all domains are polarized in one direction and the degree of polarization reaches a maximum value. The intensity of the electric field applied at this time is expressed by Et. Thereafter, even if the intensity of electric field E is lowered to zero, the degree of polarization does not decrease to zero and remains at point PS. Then, if the intensity of electric field E is increased in the negative direction, the degree of polarization changes from point A to point B (curve 41 in FIG. 8). At point B, all domains of the ferroelectric body are polarized in a direction opposite to the direction of polarization at point A. The electric field at this time is represented by $-Et$. If the intensity of electric field E is increased once again, the degree of polarization changes from point B to point A along a curve 42 in FIG. 8. In this case, even if the intensity of the electric field E is lowered to zero, the degree of polarization is kept at $-PS$.

As described above, once a voltage for generating the electric field Et is applied to the ferroelectric capacitor having the ferroelectric body between its electrodes, the direction of polarization is maintained as spontaneous polarization even if the electrodes are set in a floating state. The surface charge of the ferroelectric body due to the spontaneous polarization is not naturally lost owing to leakage, etc. Unless an electric field of the opposite direction is applied to set the degree of polarization to zero, the direction of polarization due to the electric field Et is maintained, and the degree of polarization remains at $|PS|$.

The maximum distance d (cm) between the electrodes of the ferroelectric capacitor shown in FIG. 6B must be set so that the direction of polarization of the ferroelectric body may be reversed by the potential VH corresponding to the logical "1" level of the bit line and the potential VL corresponding to the logical "0" level of the bit line. In other words, the following condition must be satisfied:

$$VH - VPF \qquad VPF - VL$$
$$(VH - VL)/2 > Et \times d$$

where VPF is a cell plate potential.

In this condition, the intensity of electric field Et is determined by the ferroelectric body, and is sufficient for reversing the direction of the polarization and keeping the degree of polarization to a maximum value. For example, if Et = 1000 V/cm, VH = 5 V, and VL = 0 V, then VPF = 2.5 V. Thus, $$d < 2.5 \text{ V} + 1000 \text{ V/cm} = 25 \text{ }\mu m$$

If the distance d between the electrodes is set, as described above, the direction of polarization can be reversed between the case where the voltage VH is applied to the bit line and the case where the voltage VL is applied to the bit line. In addition, spontaneous polarization representative of given data is retained until the direction of polarization is forcibly reversed.

A description will now be given of a specific structure of the memory cell having the ferroelectric capacitor as shown in FIG. 6A. The direction of polarization of only a portion of the ferroelectric body, to which an electric field is applied, is changed. Namely, the polarized portion has a single domain structure. Thus, the direction of polarization of respective portions of a continuous ferroelectric layer can be changed. Thus, the ferroelectric layer can be used, like an oxide layer in a memory cell of a conventional DRAM, and the data represented by the direction of polarization can be retained in a non-volatile manner. In handling the non-volatile memory, the ratio of a diffusion layer of a node connected directly to the electrode of the memory cell should be a lowest possible value, to reduce the possibility of coupling between the memory cell and a substrate potential level. If the possibility of coupling is not reduced, noise may reverse the direction of spontaneous polarization in the memory cell because of the substrate potential level at the time of switching power on or off.

FIGS. 9A and 9B show a plane pattern and a cross section, respectively of the above-described memory cell. After a field oxide film 2 for element separation is formed on the surface of a silicon substrate 1, a first conductive layer (polysilicon), which becomes a gate electrode (and word line) 4 of a charge transfer transistor, is patterned and formed on the surface of the substrate in an element region, with a gate insulation film 3 interposed. Then, with the gate electrode 4 being used as a mask, impurity diffusion regions 5 and 5-2 serving as a source or a drain of the charge transfer transistor are formed, and an insulation layer 6 such as an oxide film is formed on the substrate.

A contact hole is formed in the insulation layer 6 so as to reach the impurity diffusion region 5 serving as the source (or drain) of the charge transfer transistor. Then, a second conductive layer 7 or a polysilicon layer is deposited on the insulation layer 6 and is put in electrically conductive contact with the impurity diffusion region 5. The polysilicon layer 7 is patterned in an island-shape, and one electrode 7 of an independent ferroelectric capacitor of each memory cell can be formed.

A ferroelectric layer 8 used in common with the memory cells is formed over the surface of the substrate. A third conductive layer 9 or a polysilicon layer is deposited over the ferroelectric layer 8. The polysilicon layer 9 and ferroelectric layer 8 are patterned to form the other electrode (plate electrode) 9 of the ferroelectric capacitor in common with the respective memory cells. Consequently, that portion of the ferroelectric layer, which is not located below the third conductive layer or polysilicon layer 9, is removed.

An interlayer insulation layer 10 such as an oxide film is formed on the substrate. After a contact hole is formed in the interlayer insulation layer 10 to reach the impurity diffusion region 5-2, serving as the drain (or the source) of the charge transfer transistor, a forth conductive layer 11, which is formed of an aluminum layer, polysilicon layer, or a polysilicon/silicide composite layer, is deposited over the interlayer insulation layer 10 and is brought into electrically conductive contact with the impurity diffusion region 5-2. The fourth conductive layer 11 is patterned to form a bit line 11.

In the above process, a memory cell having a ferroelectric capacitor is formed, with a structure substantially similar to a "stacking" structure of a memory cell of a conventional DRAM. Thus, the area occupied by the memory cell is small, and the degree of integration is substantially the same as that of the conventional DRAM.

The operation of sensing memory cell data in the RAM having the above-described sense system will now be described.

First, the amount of charge transferred between a memory cell and a bit line will be described. FIGS. 10A and 10B schematically show potentials at respective points in the initial state wherein the memory cell is not connected to the bit line, and in the final state wherein the memory cell is connected to the bit line (selection state). The potential at the cell plate of a ferroelectric capacitor CF of the memory cell is VPF. Depending on whether the data written in the memory cell is "0" or "1", a potential Vi of a counter electrode (an electrode connected to a charge transfer transistor) is given by $$VL \leq Vi \leq VPF, \text{ or } VPF \leq Vi \leq VH$$

When the written data is "0", the potential Vi is equal to VL at first, and the spontaneous polarization corresponding to "0" is produced. Then, the charge transfer transistor is actuated with a low current, so that Vi becomes equal to VPF if the memory cell is not accessed for a long time in a time period other than a read time period. Consequently, Vi is set to an intermediate level between VL and VPF, in a certain access interval.

Similarly, when the written data is "1", Vi is set to VH to produce the spontaneous polarization corresponding to "1". Thus, Vi may be set to an intermediate level between VH and VPF. The potential Vi is finally set to VPF, since, when the electrode is set in the complete floating state, it is possible that the written spontaneous polarization may be reversed by the potential of the electrode owing to the leakage of charge (for example, when the charge leaks and decreases to a substrate potential level).

Supposing that an initial level of bit line capacity CB is VSS, the degree of spontaneous polarization is PS, a counter area of the ferroelectric capacitor CF is A, and the capacity of the capacitor CF is C, FIG. 10B shows the bit line potential Vf, in the final state (selection state) wherein the memory cell has been connected to the bit line, in relation to the potential Vi. When the written data is "0", $$Vf = C \cdot Vi/(C+CB)$$

When the written data is "1", $$Vf = 2 \cdot A \cdot PS/(C+CB) + C \cdot Vi/(C+CB)$$

In the case of the memory cell in which data "0" is written and in the case of the memory cell in which data "1" is written, a difference represented by:

$$2 \cdot A \cdot PS/(C+CB)$$

exists in the bit line potential vf. Thus, if a level VREF can be set as a reference level of data "0" and data "1", as shown in FIG. 10B, the data in the memory cell can be sensed, irrespective of the potential Vi of the counter electrode.

On the other hand, when the bit line potential VB, in the state prior to reading, is VCC, the bit line potential Vf in the final state (selection state) is represented by value obtained by adding $$CB \cdot VCC/(C+CB)$$

to the value of Vf, shown in FIG. 10B.

The operation of setting the above-mentioned reference level will now be described with reference to FIG. 11A and FIG. 11B. FIGS. 11A and 11B schematically show potentials at respective points, in the initial state wherein the reference cell in the reference level generating circuit REF shown in FIG. 7 is not connected to the bit line, and in the final state (selection state) wherein the reference cell is connected to the bit line. Each of two reference ferroelectric capacitors DCA and DCB in the reference cell has about half the area A/2 and half the capacity C/2 of the ferroelectric capacitor CF in the memory cell.

The cell plate potential of the reference ferroelectric capacitor DCA is represented by VPF (equal to the cell plate potential of the ferroelectric capacitor CF of the memory cell), and the cell plate potential of the reference ferroelectric capacitor DCB is represented by VP (potential VCC or potential VSS). The potential corresponding to Vi in FIG. 10 is VPF. Depending on whether the bit line potential VB prior to the read operation is VSS or VCC, the initial state of the reference ferroelectric capacitor DCA is set, as shown in FIG. 11B.

Namely, when VB=VSS, data "1" is written in the reference ferroelectric capacitor DCA. When VB=VCC, data "0" is written in the reference ferroelectric capacitor DCA. In the initial state of the reference ferroelectric capacitor DCB, data "0" is stored when VP=VCC and data "1" is stored when VP=VSS since the potential of the counter electrode is VPF. When the reference cell is connected to the bit line, the state "0" or "1" of the ferroelectric body in the reference ferroelectric capacitor DCB is unchanged, even if the bit line potential VB prior to the read operation is VSS or VCC. In the reference ferroelectric capacitor DCA, the relationship between the bit line potential VB and the potential VPF is established such that the value of data in the capacitor DCA is inverted once the reference cell is connected to the bit line. Thus, in the final state (selection state), wherein the reference cell has been connected to the bit line, when the bit line potential VB prior to the read operation is VSS, $$Vf = A \cdot PS/(C+CB) + C \cdot VPF/(C+CB)$$

This value corresponds to the reference level VREF shown in FIG. 10B.

Even when the bit line potential VB prior to the read operation is VCC, the potential Vf is set to the reference level obtained in the case where the bit line potential VB prior to the read operation, which is obtained by adding CB·VCC/(C+CB) to the reference level VREF shown in FIG. 10B, is VCC.

FIG. 7 shows a structure of the above-described reference level generating circuit REF for generating the reference level, wherein the bit line potential VB prior to the read operation is VSS. In FIG. 7, a bit line $\overline{BL}$ is connected to a single reference cell $\overline{RC}$, and a bit line BL is connected to a single reference cell RC. The paired bit lines are connected to a bit line level set circuit LS. The reference cell $\overline{RC}$, connected to the bit line $\overline{BL}$, comprises two reference ferroelectric capacitors (DC1 and DC2), each having about half the area A/2 and half the capacity C/2 of the ferroelectric capacitor CF of the memory cell, and two charge transfer transistors (DT1 and DT2) connected between first electrodes of the two reference ferroelectric capacitors and the bit line $\overline{BL}$.

Similarly, the reference cell RC connected to the bit line BL comprises two reference ferroelectric capacitors (DC3 and DC4), each having about half the area A/2 and half the capacity C/2 of the ferroelectric capacitor of the memory cell, and two charge transfer transistors (DT3 and DT4) connected between first electrodes of the two reference ferroelectric capacitors and the other bit line BL.

The gates of the two charge transfer transistors (DT1 and DT2) connected to the bit line $\overline{BL}$ receive dummy word signals through a dummy word line DWL. Second electrodes of the reference ferroelectric capacitors (DC1 and DC2), connected to the two charge transfer transistors (DT1 and DT2), are constantly supplied, respectively, with the potential VSS and an intermediate level potential (VH+VL)/2 between the potential VH corresponding to logical bit line level "1" and the potential VL corresponding to logical bit line level "0". The spontaneous polarization of the reference ferroelectric capacitor DC2 supplied with the intermediate level potential is set such that the direction of polarization is reversed when the charge transfer transistor DT2 connected to the capacitor DC2 is turned on at the data sense time.

A reset transistor DS1 is connected between the potential source VCC and a connection node Nd of the reference ferroelectric capacitor DC2 supplied with the intermediate level potential and the charge transfer transistor DT2. The reset transistor DS1 resets the potential at the connection node Nd at every one-memory cycle. The gate of the reset transistor DS1 is supplied with a reset signal DCST through a reset line.

Similarly, the gates of the two charge transfer transistors (DT3 and DT4) connected to the other bit line BL are supplied with dummy word signals through an inversion-side dummy word line $\overline{DWL}$. Second terminals of the reference ferroelectric capacitors (DC2 and DC4) connected to the two charge transfer transistors (DT3 and DT4) are constantly supplied, respectively, with the intermediate level potential and the potential VSS. The spontaneous polarization of the reference ferroelectric capacitor DC3 supplied with the intermediate level potential is set such that the direction of polarization is reversed when the charge transfer transistor DT3 connected to the capacitor DC3 is turned on at the data sense time.

A reset transistor DS2 is connected between the potential source VCC and a connection node $\overline{Nd}$ of the reference ferroelectric capacitor DC supplied with the intermediate level potential and the charge transfer transistor DT3. The reset transistor DS2 resets the potential at the connection node $\overline{Nd}$ at every one-memory cycle. The gate of the reset transistor DS2 is supplied with the reset signal DCST through the reset line.

The operation of the memory having the cell data sense system shown in FIG. 5 will now be described with reference to operation waveforms shown in FIG. 12 and the reference level generating circuit REF shown in FIG. 7. Until access to the memory cell data is started, the potential level of the bit line pair is substantially equal to the cell plate potential level VPF. After access is started and just before the charge transfer transistor of the memory cell and the charge transfer transistor of the reference cell are turned on, the level of the bit line pair is set to a level close to the potential VCC or the potential VSS (in this embodiment, potential VSS).

Then, the charge transfer transistor of the memory cell and the charge transfer transistor of the reference cell, which is connected to the bit line paired with the bit line of this memory cell, are turned on. The spontaneous polarization of one of the reference ferroelectric capacitors of the reference cell is reversed, so that one of the bit lines is set to a level corresponding to the memory cell data. Thereafter, as with a conventional DRAM, the level of the bit line pair is sense-amplified.

This operation will now be described in greater detail. Suppose that the level of the word line WL1 is raised, and the memory cell MC1 is accessed. Before the access is started, the dummy word lines DWL and $\overline{DWL}$ are set to the "H" level, the charge transfer transistors DT1 to DT4 of the reference cell are fully turned on, and the levels of all word lines WL1, $\overline{WL1}$, WL2 . . . are set to such levels that the charge transfer transistors T2 to T4 may be turned on. Also, the BLP signal has the "H" level, transistors P1 to P3 of a precharge circuit PR are turned on, and the bit lines BL and $\overline{BL}$ are set to the VPF level.

Thus, the potentials of the bit line-side electrodes (connection node Nd and $\overline{Nd}$) of the reference ferroelectric capacitors DC2 and DC3 are set to VPF, and the potentials of the bit line-side electrodes of the ferroelectric capacitors C1 to C4 of the memory cell are set to a level close to VPF. The reference ferroelectric capacitors DC1 and DC4 having the cell plate potential VSS are set to the "1" level. The reference ferroelectric capacitors DC2 and DC3 having the cell plate potential VPF are set to the "1" level at the end of the previous access operation.

When a data address is set and the access of data is started, the potentials on the dummy word lines $\overline{DWL}$ DWL and the word lines WL1, $\overline{WL1}$, WL2 . . . are set to VSS. The charge transfer transistors DT1 to DT4 of the reference cells and the charge transfer transistors T1 to T4 of the memory cells are turned off. Then, a BLP signal falls, and transistors P1 to P3 of a pre-charge circuit PR are turned off. The potential levels of bit lines BL and $\overline{BL}$ are made to differ from the VPF level. Then, a BLST signal rises, and transistors S1 to S3 of the bit line level set circuit LS are turned on. Consequently, the bit lines BL and $\overline{BL}$ are set to levels for cell data detection. In this example, the bit lines BL and $\overline{BL}$ are set to VSS level.

Thereafter, when the BLST signal falls, only the word line WL1 and the dummy word line DWL are activated to transfer data to the bit lines BL and $\overline{BL}$, thereby rendering the charge transfer transistor T1 of the memory cell and the charge transfer transistors (DT1 and DT2) of the reference cell fully conductive. The transfer level for transferring data to the bit lines BL and $\overline{BL}$ is as shown in FIGS. 10B and 11A, and a difference in level corresponding substantially to A·PS/(C+CB) occurs between the paired bit lines.

Consequently, in the ferroelectric capacitor, the greater the area A, the greater the degree of spontaneous polarization PS of ferroelectric body; and the smaller the bit line capacity CB, the greater the data transfer amount. However, unlike the conventional DRAM, it is desirable that the capacity of the memory cell be small. In this case, since the area A cannot be decreased, it is better to increase the thickness of ferroelectric body as long as the inversion condition for the spontaneous polarization PS is satisfied.

Regarding the sense amplification after the data is transferred to the bit lines BL and $\overline{BL}$, like in the conventional DRAM, the levels in the bit lines BL and $\overline{BL}$ are set to VSS-side value. In this embodiment, when the sense amplification is performed, the level of a SEP signal is raised, and then PMOS transistors SP1 and SP2 of a sense amplifier SA make the potential of the bit line varied toward VCC-side. Then, the level of a SEN signal is lowered, to maintain the level of the bit line on the VSS-side by NMOS transistors SN1 and SN2. After the level difference between the paired bit lines is sufficiently amplified, the level of a selected CSL signal is raised, to turn on transistors G1 and G2. Data are transferred to data lines DQ and $\overline{DQ}$ through the transistors G1 and G2, and the readout operation is completed.

For the next cycle, the operation for initialization is started. At first, the raised levels of the word line WL1 and dummy word line DWL are lowered. Then, the level of the SEP signal lowered, and the level of the SEN signal is raised. The sense amplifier SA is reset, and simultaneously the level of the DCST signal is raised to turn on the transistors DS1 and DS2. The potentials at connection nodes Nd and $\overline{Nd}$ are set substantially to VCC level. The reference ferroelectric capacitors DC2 and DC3, the cell plate potentials of which are VPF, are set in the write state of "1", the level of the DCST signal is lowered. At this time, the level of the BLP signal is raised to turn on the transistors P1 to P3, and the bit lines BL and $\overline{BL}$ are precharged/equalized to the VPF level.

When the precharging/equalizing step is completed, the levels of dummy word lines DWL and $\overline{DWL}$ and all word lines WL1, $\overline{WL1}$, WL2 ... are raised, and the potential at the electrode of the memory cell is set to VPF level. In this case, it is necessary that the levels of the dummy word lines DWL and $\overline{DWL}$ be sufficiently raised and the potential of the electrode of each of reference ferroelectric capacitors DC1 to DC4 be set to VPF level for the preparation for the next cycle. However, regarding the memory cell, it is sufficient that the charge transfer transistors T1 to T4 are slightly turned on, so that an electric field which may reverse the spontaneous polarity may not be applied to the cell, and so that power is supplied to the electrode of the cell to compensate the potential which has leaked to nodes other than VPF. Namely, it is sufficient that the levels of word lines WL1, $\overline{WL1}$, WL2 ... are slowly raised to the level close to a threshold voltage $V_{TH}$ of each of charge transfer transistors T1 to T4 of the memory cells added to the VpF level $V_{TH}+VpF$.

Consequently, the levels of all word lines WL1, $\overline{WL1}$, WL2 ... can be raised with a lowest possible power and current peak. Thus, when the access is repeated with a minimum cycle, it is possible that the charge transfer transistors T1 to T4 of the memory cell are not turned on.

In the case of a long access cycle, the destruction of the cell data can be prevented as follows. Namely, when the paired bit lines are equalized and kept at the intermediate potential level for a long time, before the memory cell data access is started, the charge transfer transistor of the memory cell is turned on so as to compensate leaked potential at the memory cell electrode, maintain the potential at the electrode in the VPF level, and prevent the ferroelectric spontaneous polarization from being reversed.

The read operation with the bit line potential VB, prior to readout, equal to VSS has been described. The VCC system wherein the bit line potential VS prior to the readout, is VCC differs from the VSS system in the following respects:

(1) One terminal of each of transistors S1 and S3, controlled by the BLST signal, is connected to VCC potential in order to cause the transistors S1 and S3 to set the levels of bit lines BL and $\overline{BL}$ near the VCC level, (2) One terminal of each of transistors DS1 to DS2, controlled by the DCST signal, is connected to VSS potential in order to cause the transistors DS1 to DS2 to write "0" in the reference ferroelectric capacitors DC2 and DC3, and (3) The order of operation steps of PMOS transistors SP1 and SP2 and NMOS transistors SN1 and SN2 for operating the sense amplifier SA is reversed, compared to the above-described operation steps.

The data write process for writing data in the memory cell is the same as is employed in a conventional DRAM. Thus, a detailed description thereof may be omitted.

The above description has been directed to the operation of the data sense amplification. When the above memory device is utilized as a non-volatile RAM, attention should be paid to the order of set/reset of internal signals at the time of the switching ON/OFF of the power. If the attention is not fully paid, the contents of the ferroelectric capacitor may be written owing to transient voltage. In particular, the potential level VPF, which is the cell plate level and the level of paired bit lines, has a large load capacity and varies slowly at the power ON/OFF time. Thus, the VPF level and the word line activation timing must be determined in a predetermined order of operation steps.

If the word line is activated before the cell plate level and the bit line level reach the VPF level, the cell contents may be destroyed. FIG. 13 schematically shows the node level raising process at the time of power "ON".

In FIG. 13 a cell plate level detecting circuit 91 monitors the cell plate level. An output $\psi P$ at the time of power "ON" is "L". When the cell plate level becomes close to VPF, the output $\psi P$ becomes "H". A bit line precharge level detecting circuit 92 monitors the bit line potential level. At the time of power "ON", the output $\psi B$ is "L". When the level of the BLP signal rises upon power "ON" and the bit line is precharged so that the level of the bit line may reach VPF, and the output $\psi B$ becomes "H". After the two signals $\psi P$ and $\psi B$ are fed to an AND gate 93, the outputs of a word line level generating circuit 94 and a dummy word line level generating circuit 95 are supplied to the word line and the dummy word line through the AND gates 96 and 97. Consequently, the potential at the bit line-side electrodes of the memory cell and the reference cell is changed to VPF. Until this time, the charge transfer transistor is turned off, and the bit line-side electrode is set in a floating state. Thus, an electric field for reversing the spontaneous polarization is not applied to the ferroelectric body of the ferroelectric capacitor.

Further, after the level of the dummy word line is fully raised by the output of the dummy word line level generating circuit 95, and the bit line-side electrode level of the reference cell is set to VPF, a memory control external signal is received by an AND gate 98. Thus, without erroneous sense operation, the memory cell can be accessed.

In other words, after the cell plate level and the bit line level are fully raised by the sequence of the operation for raising the potential levels at electrode nodes at the power "ON" time, the charge transfer transistor between the cell and the bit line is turned on. Thereafter, the memory control external signal is received, and the internal signal is generated to enable the cell data sense to be performed.

At the power "OFF" time, unless the bit line level and the cell plate level are lowered after the memory cell and the reference cell are completely cut off from the bit line, it is possible that a transient voltage which may reverse the spontaneous polarization of the ferroelectric capacitor of the memory cell can be produced. Therefore, it is necessary that the cell plate level VPF and the drive signal SEN for driving NMOS transistors SN1 and SN2 of sense amplifier SA follow the change in VCC with a sufficient time constant. A circuit structure for meeting this condition is shown in FIG. 14.

In the circuit shown in FIG. 14, the output VPF of a cell plate level generating circuit 101 and the output SEN of an SEN level generating circuit 102 are provided with sufficiently large capacitances, as indicated by broken lines. Thus, even if the potential VCC is lowered to VSS, the level of the VCC slowly lowers if charge is not supplied directly to the potential VCC. For this purpose, a diode 103 is connected between a VCC node and the two level generating circuits 101 and 102.

The outputs SEN and VPF are turned off at the inherent time constant of the circuit. Thus, these outputs are turned off with sufficient time allowance after the word line level generating circuit 94 and the dummy word line level generating circuit 95 shown, in FIG. 13, are turned off in response to the power "OFF". For this reason, the cell is not destroyed.

According to the sequence of the operation for lowering the potential levels at respective electrodes at the power "OFF" time, the outputs of the cell plate level generating circuit and the sense amplifier drive level generating circuit are completely turned off, after the circuit for receiving the memory control external signal to produce the internal signal and the circuit for generating the signal for turning on the charge transfer transistor are turned off.

In the above description, the two reference ferroelectric capacitors of the reference cell are connected to one bit line through different charge transfer transistors. However, the same operation and advantage can be attained, even if two reference ferroelectric capacitors (DC1 and DC2) are connected commonly to one bit line BL through a single charge transfer transistor DT1, and two reference ferroelectric capacitors (DC3 and DC4) are connected commonly to the other bit line BL through a single charge transfer transistor DT3, as shown in FIG. 15.

In putting the above-proposed semiconductor memory to practical use, it is difficult to reduce the area and capacity of each of the two reference ferroelectric capacitors of the reference cell to substantially half the area and capacity of the ferroelectric capacitor of the memory cell. If a three-dimensional cell structure is employed, it becomes difficult to pattern the capacitor of the reference cell to have substantially half the area and capacity of the capacitor of the memory cell, and to attain a desired capacity because of variation in quality arising from manufacturing processes. Under the circumstances, in the cell data sense system of the above-proposed semiconductor memory, it is necessary to reduce the area and capacity of each of the two reference ferroelectric capacitors to substantially half the area and capacity of the ferroelectric capacitor of the memory cell, to thereby ensure highly reliable operation. Consequently, it the manufacturing margin as well as operational reliability are lowered and the yield of manufacture.

SUMMARY OF THE INVENTION

The object of the present invention is to provide a non-volatile semiconductor memory device using a ferroelectric cell and not requiring a refresh operation, wherein it is not necessary to make the structure of the memory device complex, despite the need to reduce the area and capacity of each of reference ferroelectric capacitors of a reference cell to substantially half the area and capacity of each of ferroelectric capacitors of a memory cell.

To achieve the above object, a semiconductor memory device of the present invention comprises a first bit line, a second bit line paired with the first bit line, a third bit line branch-connected with the first bit line, a fourth bit line paired with the third bit line and branch-connected with the second bit line, a memory cell array connected to the bit lines, a first reference cell connected to the first bit line and the third bit line, including by a cell which is formed of substantially the same area, capacity and structure as the memory cell array, and a second reference cell connected to the second bit line and the fourth bit line, and having substantially the same area, capacity and structure as the memory cell array.

In this semiconductor memory device, the area, capacity and structure of each reference cell is substantially identical to those of each memory cell, and each reference cell is connected to two bit lines. Thus, while the function of the conventional reference cell is substantially maintained, the following advantages cam be brought about.

Namely, the present device of the invention can be provided with a new function mode, the flush mode. It further not necessary to use a special pattern or structure for a reference ferroelectric capacitor DC1. Thus, the time required for designing can be shortened. In addition, the manufacturing margin and the reliability in circuit operation can be increased, as well as the yield of manufacture.

BRIEF DESCRIPTION OF THE DRAWINGS

FIG. 3 shows waveforms illustrative of the cell data sense operation of the cell data sense system shown in FIG. 1;

FIG. 4 shows waveforms illustrative of a flush write operation in the cell data sense system shown in FIG. 1;

FIGS. 10A and 10B are illustrative of a process of reading out data from a memory cell shown in FIG. 5;

FIGS. 11A and 11B are illustrative of a process of generating a reference level by a reference cell shown in FIG. 7;

FIG. 15 shows a modification of the reference level generating circuit shown in FIG. 7.

DETAILED DESCRIPTION OF THE PREFERRED EMBODIMENT

An embodiment of the present invention will now be described with reference to the accompanying drawings.

Figure 1A:
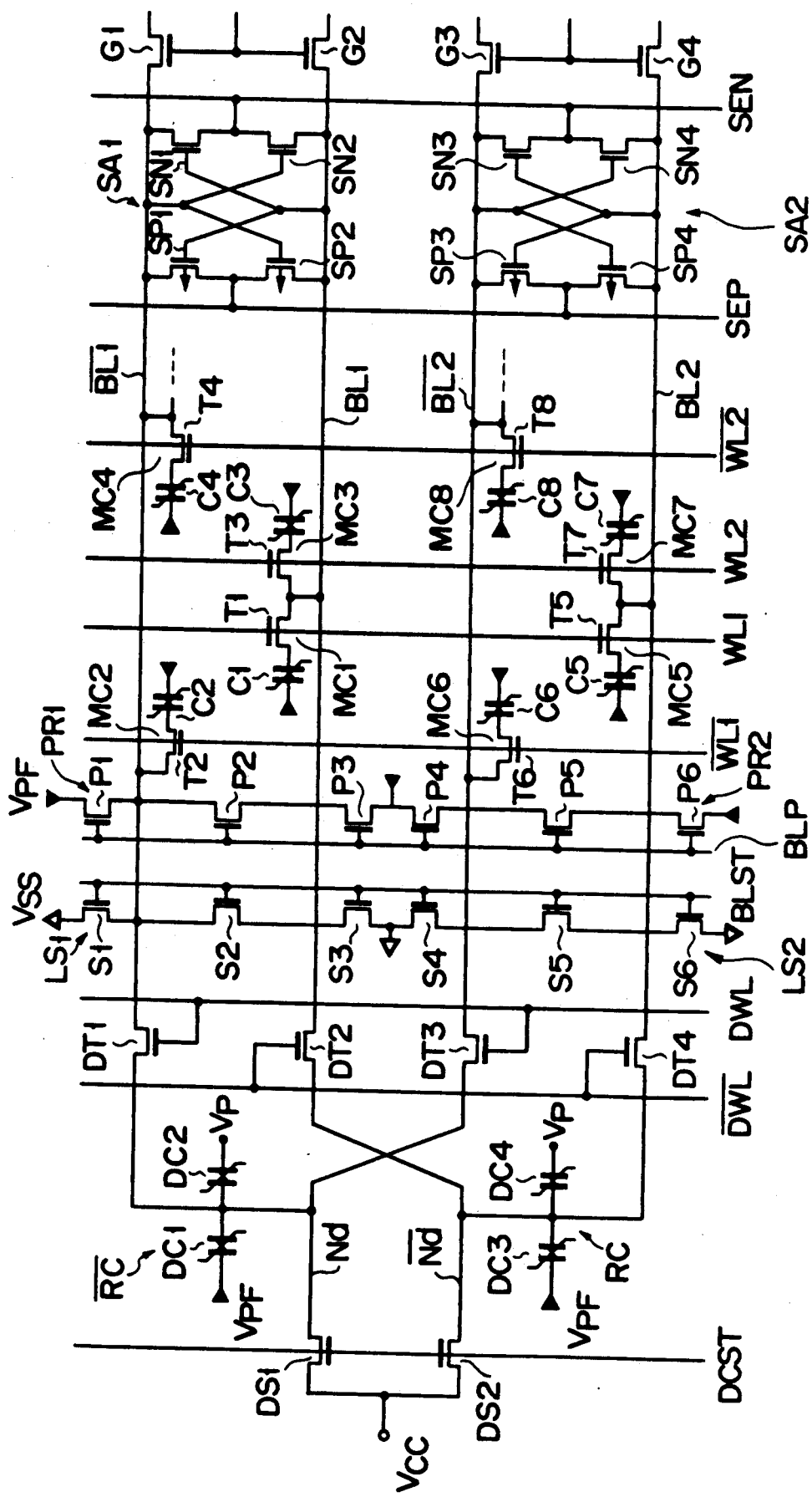
FIG. 1A is a circuit diagram of an example of a cell data sense system of a semiconductor memory according to an embodiment of the present invention.
Figure 1B:
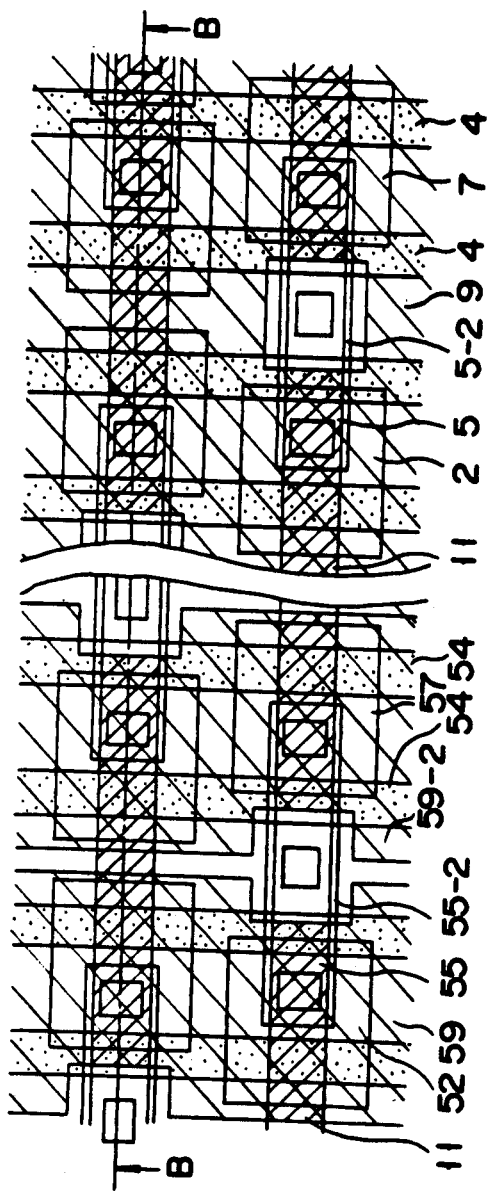
FIG. 1B shows a plane pattern of the embodiment shown in FIG. 1A.
Figure 1C:
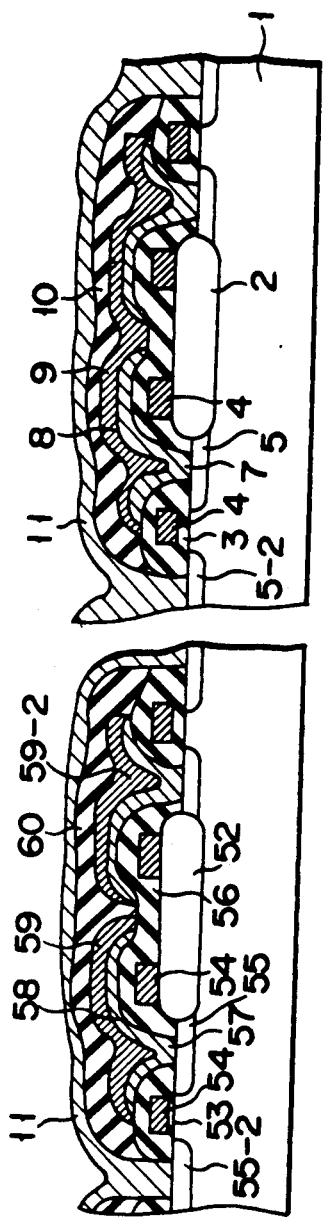
FIG. 1C is a cross section taken along line B—B in FIG. 1B.

FIGS. 1A, 1B, and 1C show a part of the semiconductor memory device of the present invention. Compared to the semiconductor memory which has been described with reference to FIGS. 5 to 15, the structure of a reference level generating circuit REF is slightly different. The other part of the memory device shown in FIGS. 1A to 1C is identical to that of the memory device shown in FIGS. 5 to 15. FIG. 1A shows an example of a cell data sense system of the semiconductor memory device according to an embodiment of the invention. FIG. 1B shows a plane pattern of the embodiment in FIG. 1A. FIG. 1C is a cross section taken along line B—B in FIG. 1B.

FIGS. 1B and 1C are illustrative of the fact that reference cells RC and $\overline{RC}$ shown in FIG. 1A have substantially the same patterns as memory cell capacitors MC1 to MC8.

In FIGS. 1B and 1C, the structure of reference cell capacitors is similar to that of memory cell capacitors. At first, an element separation field oxide film 52 is formed on the surface of a silicon substrate 1. Then, a first conductive layer or a polysilicon layer, which becomes a gate electrode (and a word line) of a charge transfer transistor via a gate insulation film 53, is patterned on an element region on the surface of the substrate. By using the gate electrode 54 as a mask, an impurity diffusion region 55 (55-2), which serves as a source or a drain of the charge transfer transistor, is formed. Further, an insulation film 56 such as an oxide film, is formed on the substrate.

A contact hole is formed in the insulation film 56 so as to reach the impurity diffusion region 55 serving as the source (or the drain) of the charge transfer transistor. Then, a second conductive layer or a polysilicon layer 57 is deposited on the insulation layer 56, thus making an electrically conductive contact with the impurity diffusion region 55. The polysilicon layer 57 is patterned in an island-shape, and one electrode 57 of a ferroelectric capacitor, used in an individual reference cell, is formed. A ferroelectric layer 58, common to all memory cells on the substrate, is formed. A third conductive layer or a polysilicon layer 59, 59-2 is deposited on the ferroelectric layer 58. The polysilicon layer 59, 59-2 and ferroelectric layer 58 are patterned, and the other electrode (plate electrode) of the ferroelectric capacitor is provided in common with all memory cells. A ferroelectric substance existing other areas than the area below the third conductive layer (polysilicon) 59, 59-2 is removed.

Further, an interlayer insulation layer 60 such as an oxide film is then formed on the substrate. After a contact hole is formed in the insulation film 60 so as to reach the impurity diffusion region 55-2, serving as the drain (or source) of the charge transfer transistor, a fourth conductive layer 61, i.e., an aluminum film, a polysilicon film, or a composite film of polysilicon and silicide, is deposited on the interlayer insulation layer 60, thus making an electrically conductive contact with the impurity diffusion region 55-2. The fourth conductive layer 61 is patterned, and a bit line 11 is formed.

In a reference level generating circuit REF according to the present invention, two reference ferroelectric capacitors (DC1, DC2) of a reference cell $\overline{RC}$ have substantially the same structure as ferroelectric capacitors CF of a memory cell, and have substantially the same area A and capacity C as the ferroelectric capacitors CF. First electrodes of the two reference ferroelectric capacitors (DC1, DC2) are commonly connected to a common connection node Nd. The common connection node Nd is connected to a bit line $\overline{BL1}$ of paired bit lines (BL1, BL1) through a transistor DT1, and to a bit line BL2 of paired bit lines (BL2, BL2) through a transistor DT3. The gates of the transistors DT1 and DT3 are supplied with a dummy word line signal through a dummy word line DWL. Thus, reference cell RC is connected to double bit line capacity.

Second electrodes of the reference ferroelectric capacitors (DC1, DC2) are connected to an intermediate level potential (VH+VL)/2 between potential VH corresponding to logical bit line level "1" and potential VL corresponding to logical bit line level "0", and to a power source potential VP, respectively. The spontaneous polarization of the reference ferroelectric capacitor DC1, supplied with the intermediate level potential, is set such that the direction of polarization is reversed when the charge transfer transistors DT1 and DT3, connected to the capacitor DC1, are turned on at the data sense time. A reset transistor DS1 is connected between the common connection node Nd and a VCC potential terminal. The reset transistor DS1 resets the potential at the node Nd for each memory cycle.

Similarly, two reference ferroelectric capacitors (DC3, DC4) of a reference cell RC have the same structure as the ferroelectric capacitors CF of the memory cell and have substantially the same area and capacity as the capacitor CF. A common connection node Nd of first electrodes of the reference ferroelectric capacitors DC3 and DC4 is connected to the bit line BL1 of the paired bit lines (BL1, BL1) through a transistor DT2 and to the bit line BL2 of the paired bit lines (BL2, BL2) through a transistor DT4. The gates of the two transistors DT2 and DT4 are supplied with a dummy word line signal through an inversion-side dummy word line DWL. Thus, the reference cell RC is connected to double bit line capacity.

Second electrodes of the two reference ferroelectric capacitors (DC3, DC4) are connected to the intermediate level potential and power source potential VP, respectively. In this case, the spontaneous polarization of the reference ferroelectric capacitor, supplied with the intermediate level potential, is set such that the direction of polarization is reversed when the charge transfer transistors DT2 and DT4, connected to the capacitor DC3, are turned on at the data sense time. A reset transistor DS2, for resetting the potential at the node Nd for each memory cycle, is connected between the node Nd and the VCC potential terminal.

In the memory cell data sense system in the RAM having the sense system with the above-described structure, the memory cell data level potential is applied to the bit lines, as shown in FIGS. 10A and 10B. On the other hand, the reference level potential Vref is produced in a manner slightly different from the manner shown in FIGS. 11A and 11B. The manner in which the reference level potential VREF will now be described with reference to FIGS. 2A and 2B.

Figures 2A, 2B:
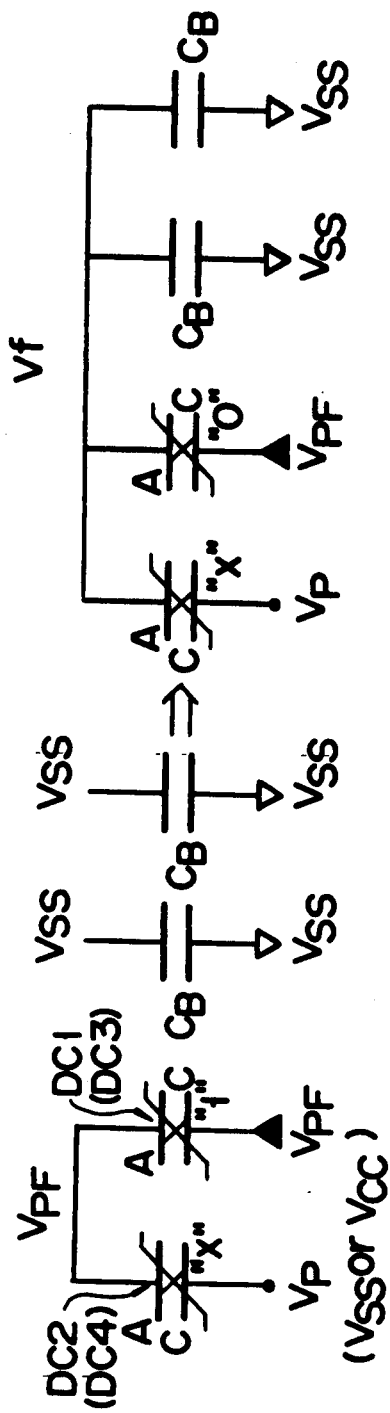
FIG. 2A and FIG. 2B illustrate a reference level generating process according to a reference cell shown in FIG. 1.
Figure 5:
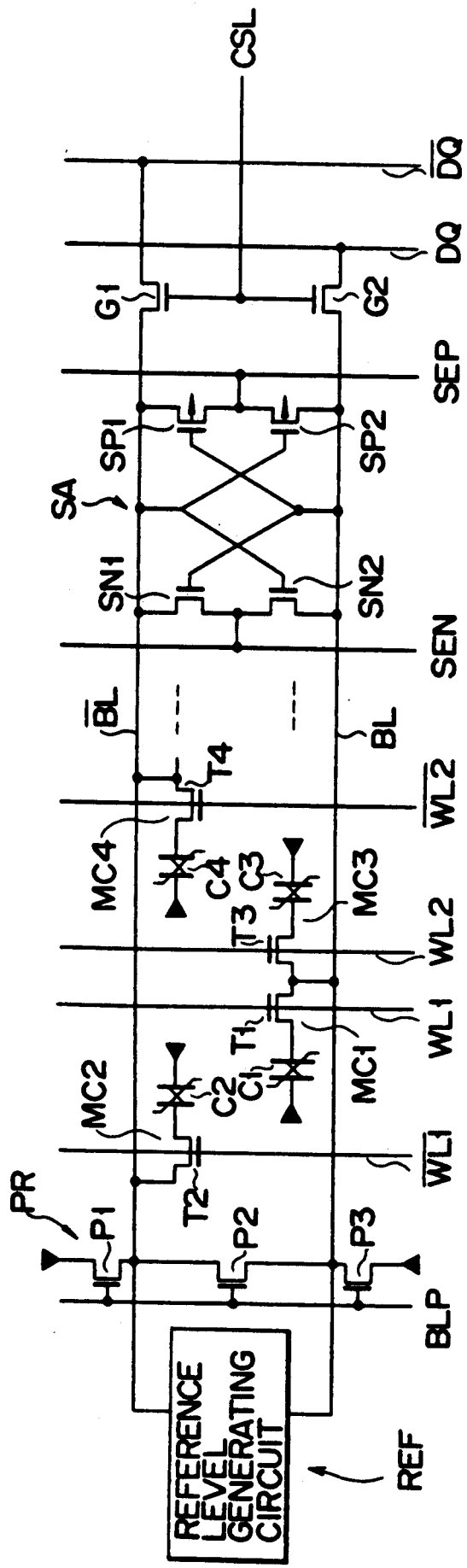
FIG. 5 is a circuit diagram showing an example of a cell data sense system of a semiconductor memory according to another example.
Figure 6A:
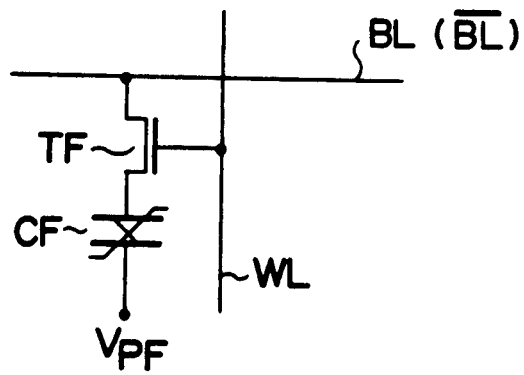
FIG. 6A shows an equivalent circuit of a memory cell having a ferroelectric capacitor shown in FIG. 5.
Figure 6B:
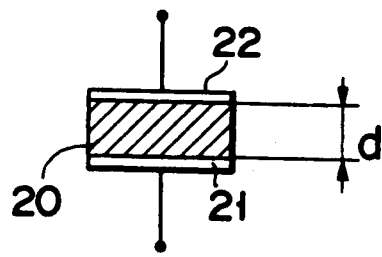
FIG. 6B shows an equivalent circuit of a memory cell including a structure of a ferroelectric capacitor shown in FIG. 6A.
Figure 7:
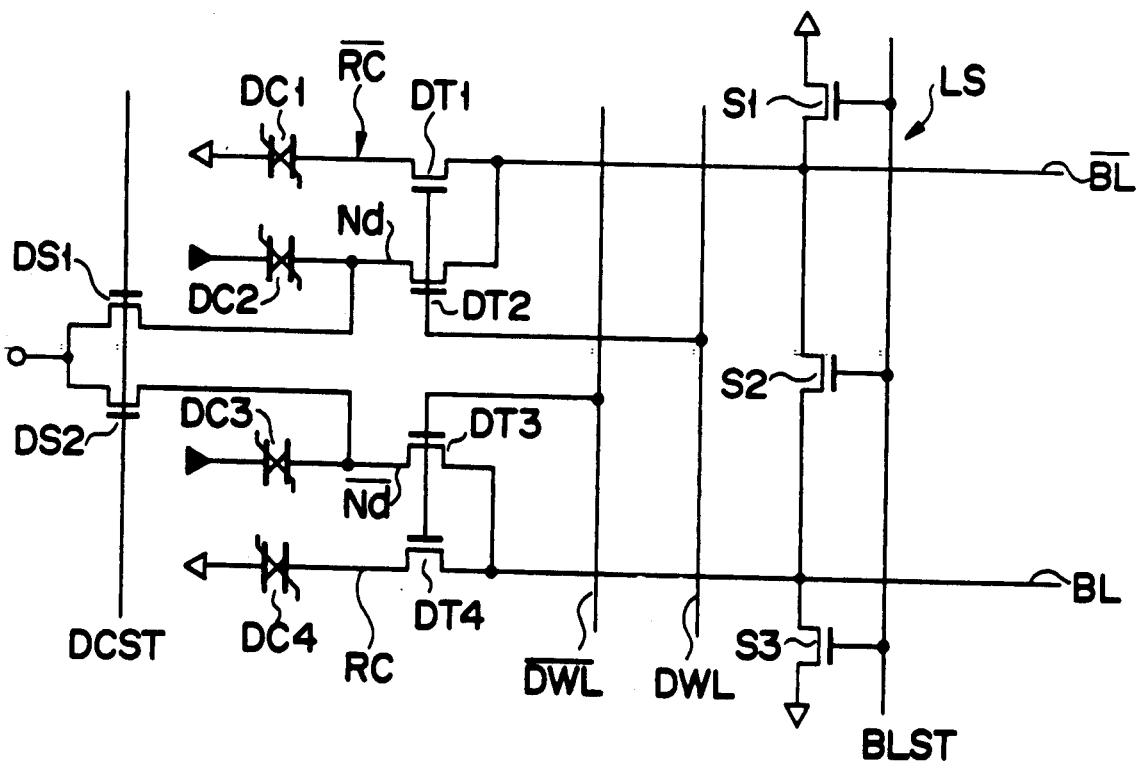
FIG. 7 shows an example of a reference level generating circuit shown in FIG. 5.
Figure 8:
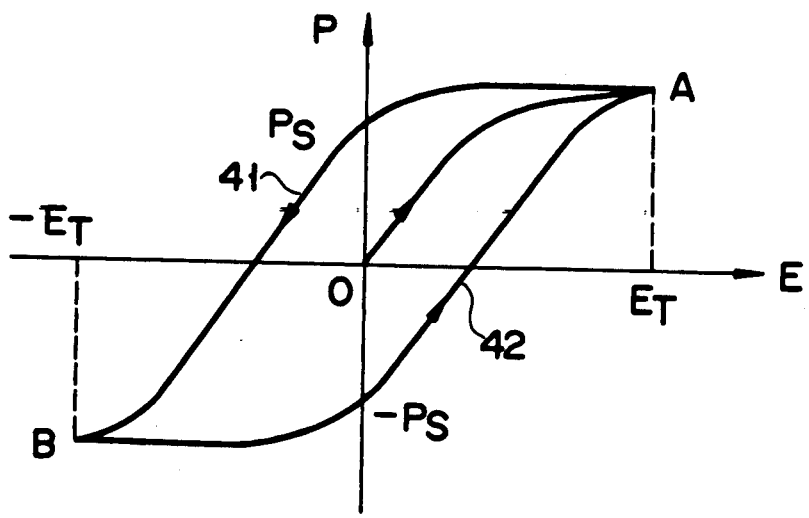
FIG. 8 shows a characteristic of the relationship between the polarization of a ferroelectric body and an electric field.
Figure 9A:
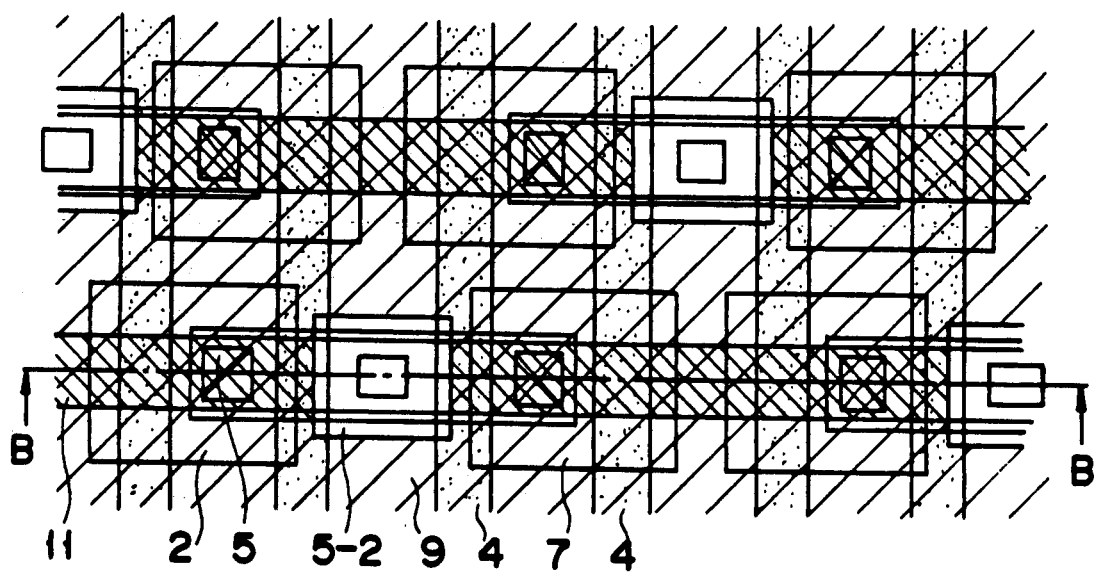
FIG. 9A shows a plane pattern of the memory cell shown in FIG. 6A.
Figure 9B:
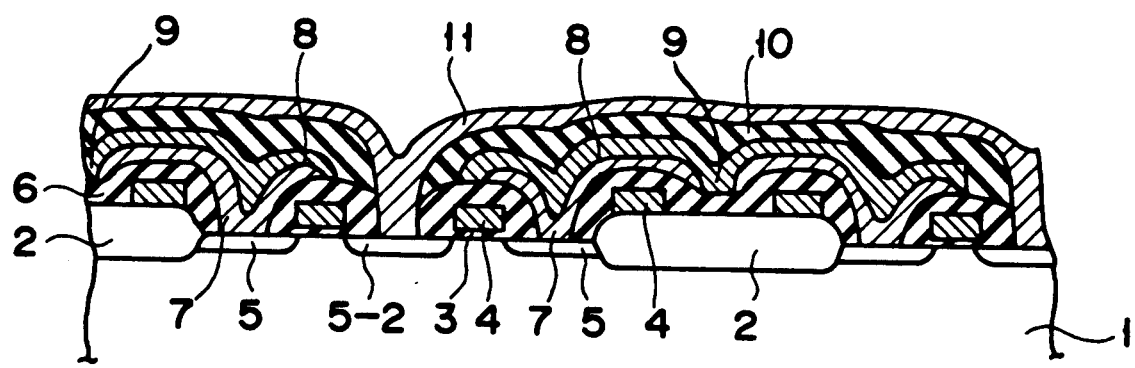
FIG. 9B is a cross section taken along line B—B in FIG. 9A.
Figure 12:
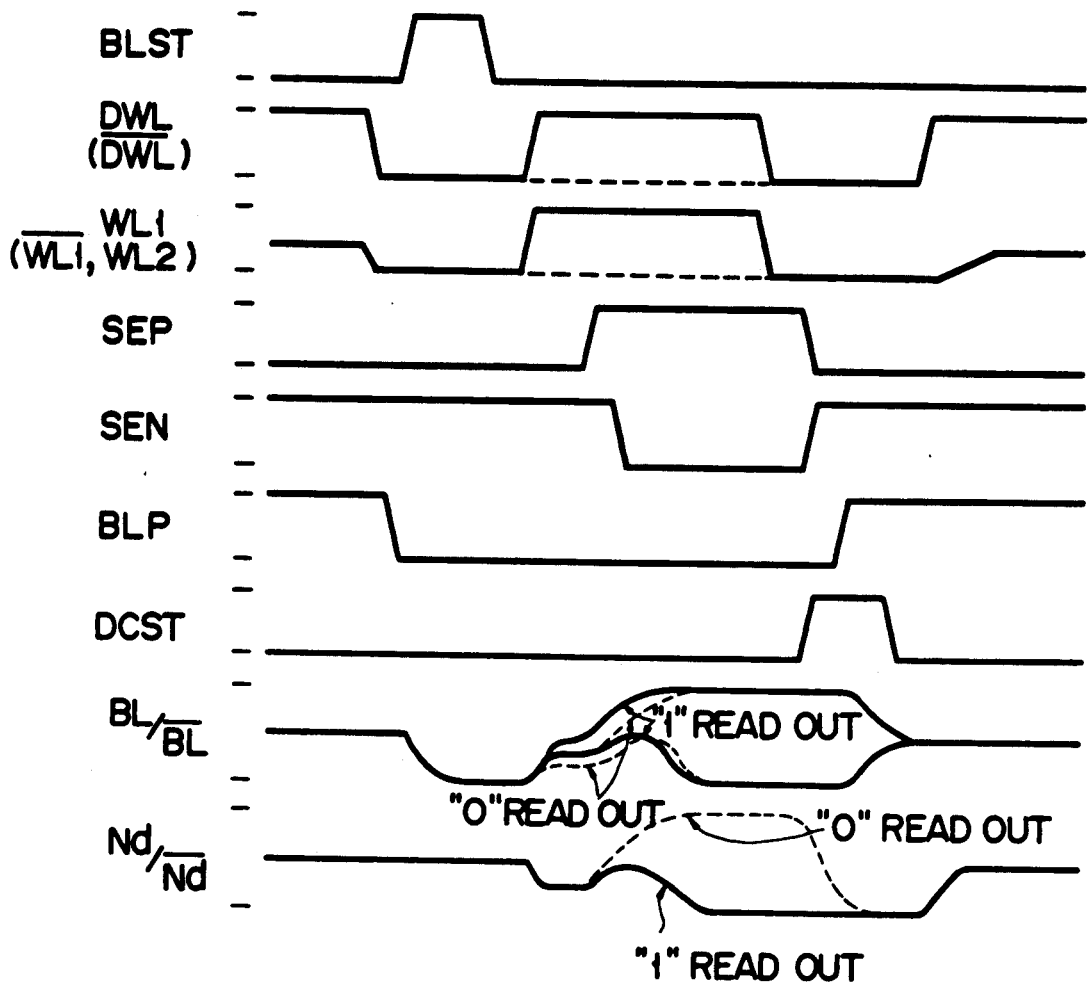
FIG. 12 shows waveforms illustrative of the operation of the cell data sense system shown in FIG. 5.
Figure 13:
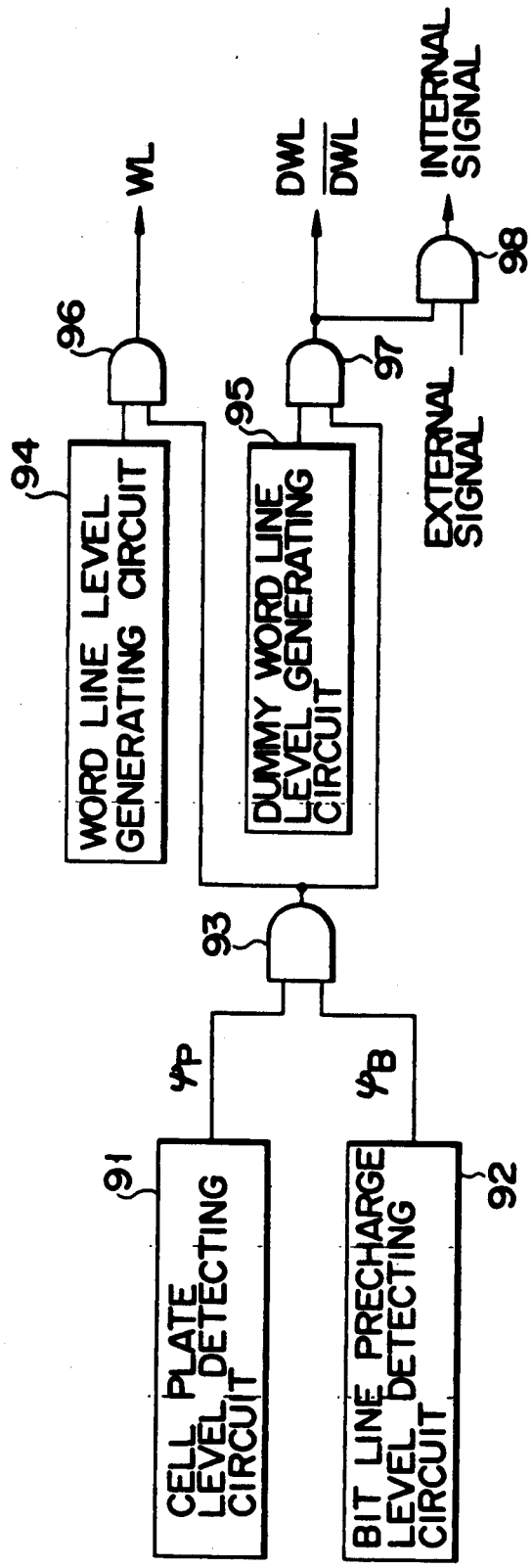
FIG. 13 is illustrative of the sequence of the operation for actuating a memory circuit at the time of power "ON"
Figure 14:
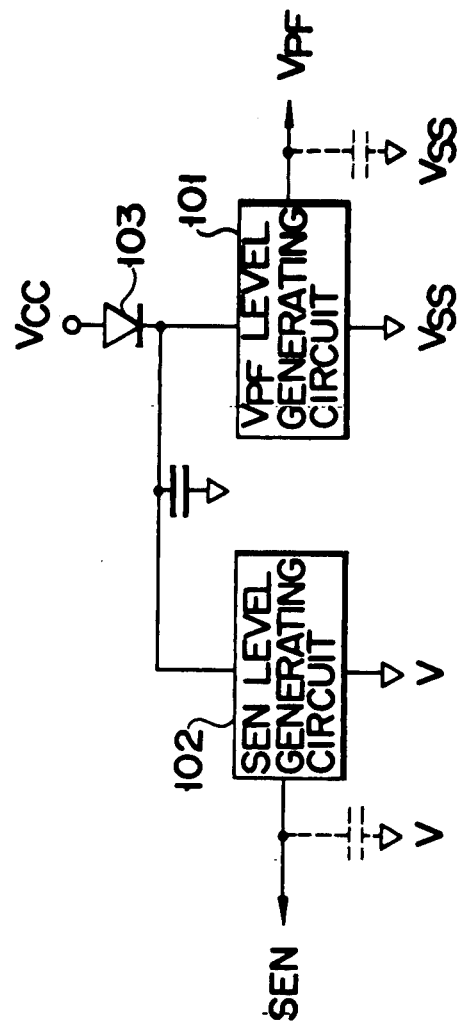
FIG. 14 is illustrative of a process of resetting the output of a cell plate level generating circuit and the output of an SEN level generating circuit at the time of power "OFF"
Figure 16:
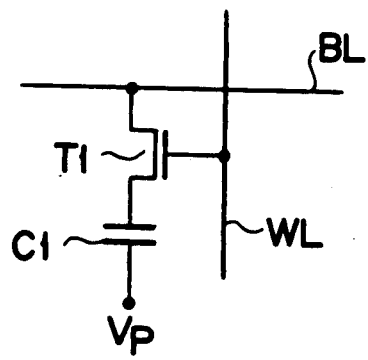
FIG. 16 is an equivalent circuit of a memory cell of a conventional DRAM.

FIGS. 2A and 2B schematically show the potentials at respective points in the initial state of the data sense system wherein, for example, the reference cell RC is not connected to the bit lines BL1 and BL2, and in the final state, the selection state in which the reference RC is connected to the bit lines BL1 and BL2. Each of the two reference ferroelectric capacitors DC1 and DC2 of the reference cell has the same capacity C as the ferroelectric capacitor CF of the memory cell. The cell plate potential of the reference ferroelectric capacitor DC1 is VPF. The cell plate potential of the other reference ferroelectric capacitor DC2 is VP (VCC potential or VSS potential), and the potential at the counter electrode of the capacitor DC2 is VPF. Thus depending on whether the cell plate potential VP is VSS or VCC, data is written in the reference ferroelectric capacitor DC2, as shown in FIG. 2B.

When VP=VSS, data "1" is written in the reference ferroelectric capacitor DC2. When VP=VCC, data "0" is written in reference ferroelectric capacitor DC2. Whether the bit line potential VB prior to the readout operation is VSS or VCC, the state "0" or "1" of the ferroelectric body in the reference ferroelectric capacitor DC2 is unchanged. Data "1" is written in advance in the reference ferroelectric capacitor DC1, the cell plate potential of which is VPF, so that the spontaneous polarization of the ferroelectric body may be reversed when the capacitor DC1 is connected to the bit line at the VSS level. The bit line potential VB is changed to the VSS level so that the contents of the reference cell RC may be reversed when the reference cell RC is connected to the bit line BL1 and BL2. Thus, the final state, selection state, after the reference cell RC is connected to the bit lines BL1 and BL2 is represented by the formula:

$$Vf = A \cdot PS/(C+CB) + C \cdot VPF/(C+CB)$$

The potential at the final state corresponds to the reference level VREF shown in FIG. 10B.

As described above, one reference cell supplies the same reference level potential to one of the pairs of bit lines (BL1 and BL2). The other pair of bit lines BL1 and BL2 are supplied with a potential level corresponding to the data in the memory cell connected to the respective bit lines. Thus, the cell data sensed by sense amplifiers SA1 and SA2 can be performed, and the outputs of the sense amplifiers SA1 and SA2 selected by column selection are supplied to paired data lines.

Like paired bit lines (BL1 and BL1), paired bit lines (BL1 and BL2) are connected to a bit line level set circuit LS2, a precharge circuit PR2, the sense amplifier SA2, and column selection transistors G3 and G4. Like the bit line level set circuit LS1, the bit line level set circuit LS2 comprises transistors S4 to S6. The precharge circuit PR2, like precharge circuit PR1, comprises transistors R4 to R6. The sense amplifier SA2, like sense amplifier SA1, comprises PMOS transistors SP3 and SP4 and NMOS transistors SN3 and SN4.

FIG. 3 is illustrative of the operation of the memory cell data sense system. Compared to the operation of the memory cell data sense system described with reference to FIGS. 5 to 15, dummy word signals are caused to flow through the dummy word line DWL and inversion-side dummy word line DWL in a different manner.

The potentials on the paired bit lines are equalized substantially to the level of the cell plate potential VPF until the access to memory cell data is started. The potentials on the paired bit lines are set close to the VSS potential, after the access is started and until just before the charge transfer transistor of the memory cell and the charge transfer transistor of the reference cell are turned on. Thereafter, the charge transfer transistor of the memory cell and the charge transfer transistor of the reference cell, connected to a bit line paired with the bit line connected to the memory cell, are turned on. Then, the direction of the spontaneous polarization of one of the reference ferroelectric capacitors of the reference cell is reversed, and a reference level potential is applied on one of the bit lines. The other bit line is supplied with a data level potential of the memory cell data. The operation up to this point is the same as the operation of the memory cell data sense system which were already described.

Thereafter, the potential levels of the bit lines are amplified. Prior to the sense operation, in which the SEP signal for turning on the PMOS transistors (SP1, SP2) (SP3, SP4) of the sense amplifiers SA1 and SA2 is set in the "H" level, the dummy word line DWL and the inversion-side dummy word line $\overline{DWL}$ which have been set in the "H" level are set to the "L" level. Then, the reference cells $\overline{RC}$ and RC are separated from the bit lines. This operation prevents the sense operation from being performed in the state wherein the bit lines $\overline{BL1}$ and $\overline{BL2}$, or the bit lines BL1 and BL2, are short circuited.

The timing at which the SEP signal is set in the "H" level will now be described. Compared to the above-described memory cell data sense system, it is necessary to delay this timing by a degree corresponding to the time period needed for lowering the level of the dummy word line DWL or the inversion-side dummy word line $\overline{DWL}$ to the "L" level. The data access time is delayed accordingly. However, this delay must be ignored, since the present invention has the very important advantage in which each of the reference ferroelectric capacitors DC1 to DC4 can be manufactured with the same size and structure as the ferroelectric capacitor CF of the memory cell.

Whether the VSS system in which the bit line potential VB prior to the readout is VSS, or the VCC system in which the bit line potential VB prior to the readout is VCC, is employed, the above operation can be achieved by the following three features, as in the abovedescribed memory cell data sense system:

(1) One terminal of each of the transistors (S1 and S3) (S4 and S6) is supplied with VSS potential or VCC potential, in order to cause the transistors (S1 to S3) (S4 to S6), controlled by the BLST signal, to set the potentials of the paired bit lines ($\overline{BL1}$ and BL1) ($\overline{BL2}$ and BL2) to a level close to the power source potential, (2) One terminal of each of the transistors DS1 and DS2 is supplied with VCC potential or VSS potential, in order to cause the transistors DS1 and DS2 controlled by the DCST signal to write "1" or "0" in the reference ferroelectric capacitors DC1 and DC3, and (3) The order of steps for operating the PMOS transistors (SP1, SP2) (SP3, SP4) and the NMOS transistors (SN1, SN2) (SN3, SN4) to actuate the sense amplifiers SA1 and SA2 is reversed between the VSS system and the VCC system.

The process of writing data in the memory cell is identical to the process employed in a conventional DRAM. Thus, a detailed description thereof may be omitted.

In a preferred embodiment of the present invention, a flush write mode can be provided for initializing the reference cell or forcibly transferring the power source level potential on the bit line to simultaneously rewrite the contents of the memory cell. In the flush write mode, the potential level of only one word line is raised to simultaneously rewrite the associated memory cells for transferring cell data to the bit lines, i.e., MC1 and MC5 in FIG. 1. When the memory device of the present invention is used as a buffer memory for image processing data, the flush write mode is employed to clear images at high speed. FIG. 4 shows operation waveforms in the case where the sense system shown in FIG. 1 is operated by the flush write mode.

In this mode, the reference level potential VREF is not applied on the bit line by the reference cell in the access cycle, unlike the above description. Rather, when the level of the dummy word line DWL or the inversion-side dummy word line DWL is raised, the DCST signal is set in the "H" level to turn on the transistors DS1 and DS2. Thus, the power source potential is directly applied to the bit lines, and the sense system is operated, irrespective of the contents of the memory cell, thereby to determine the "H" level or the "L" level of the paired bit lines. For example, suppose that the level of the word line WL1 is raised to carry out the flash write operation on the memory cells MC1 and MC5. In this case, when "0" is written, the dummy word line DWL is set in the "H" level. Then, irrespective of the data "0" or "1" in the memory cells MC1 and MC5, the paired bit lines $\overline{BL1}$ and $\overline{BL2}$ are set in the "H" level. The potential of the other paired bit lines BL1 and BL2 are set in the "L" level, and the data in the memory cells MC1 and MC5 is changed to "0". On the other hand, when "0" is written, if the inversion-side dummy word line $\overline{DWL}$ is set in the "H" level, the contents of the memory cells MC1 and MC5 are cancelled and the bit lines BL1 and BL2 are set in the "H" level. Thus, the data in the memory cells MC1 and MC5 is changed to "1". Thus, data "0" or "1" is simultaneously written in the memory cells associated with the word line WL1.

Figure 1D:
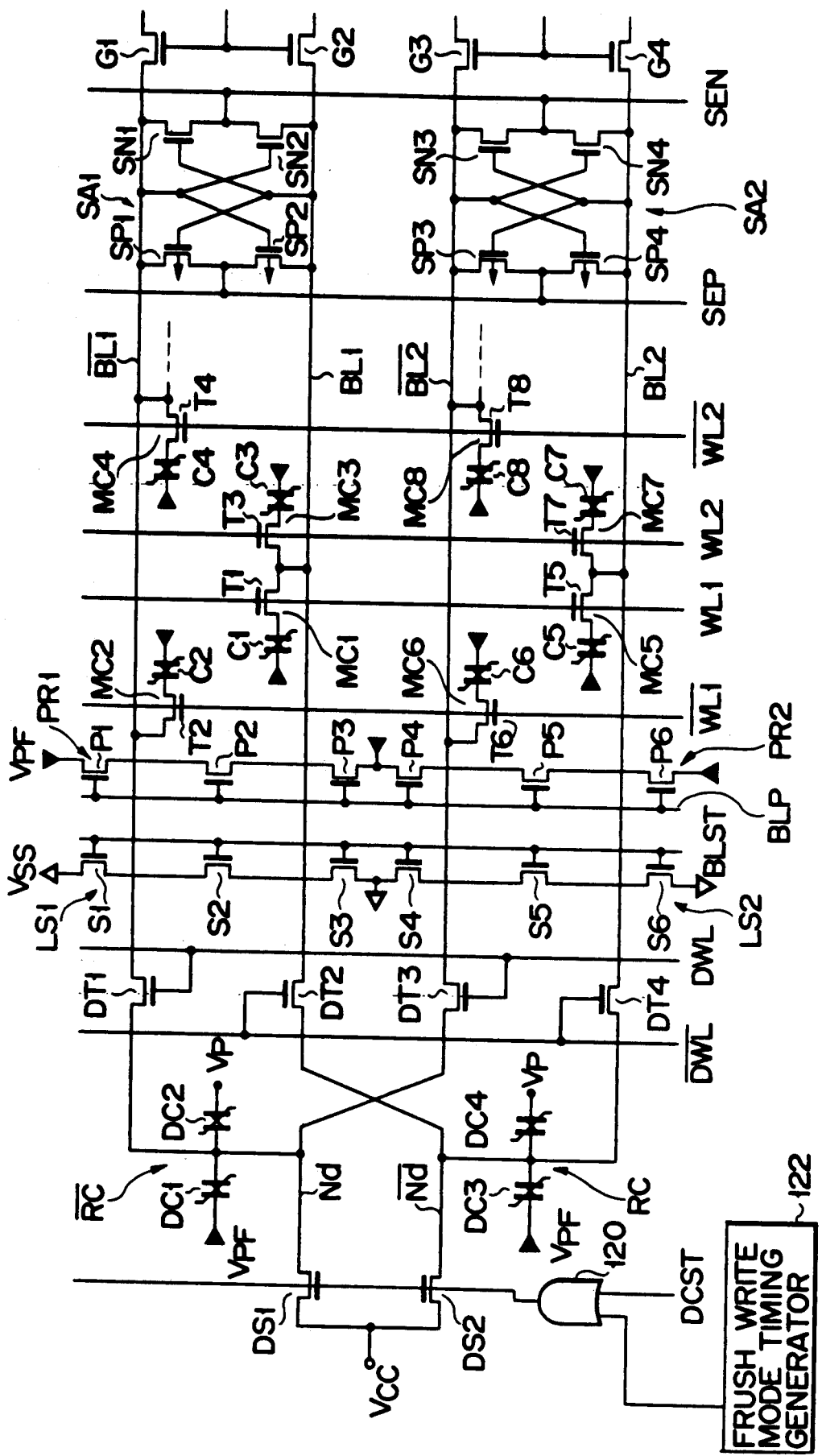
FIG. 1D is a circuit diagram of an other example of a semiconductor memory according to an embodiment of the present invention.

Another embodiment of the invention is shown in FIG. 1D. When a control signal DCST is supplied to the gates of switching memory cells DS1 and DS2, a timing signal from a flush write mode timing generator 122 is fed to an OR gate 120. By this structure, the reset of data can be achieved with simple structure, in a memory such as an image memory in which all data needs to be set to "0" or "1".

As described above, according to the present invention, a semiconductor memory device or a RAM having the above-described circuit system is constructed by using a reference ferroelectric capacitor of a reference cell having substantially the same area and capacity as a ferroelectric capacitor of a memory cell. This RAM has the same integration degree as a conventional DRAM and requires no refresh operation. At the time of power "OFF", data can be retained in a non-volatile manner. Also, the read/write access time is substantially the same as in the conventional DRAM. The RAM of the present invention can be manufactured by the techniques used for the conventional DRAM.

In addition, according to the present invention, the memory device can have a novel operational mode, and it is not necessary to provide a special pattern or structure of the reference cell, separately from the pattern or structure of the memory cell. Thus, in the actual manufacturing process, the manufacturing margin and the reliability in circuit operation can be increased, as can the yield of manufacture.

The semiconductor memory device of the present invention can effectively be used as a substitute for a magnetic memory, or can effectively be used in the field of image data buffer memories for image processing.

What is claimed is:

1. A semiconductor memory device comprising:
a first bit line;
a second bit line, paired with the first bit line;
a third bit line connected to the first bit line;

a fourth bit line paired with the third bit line and connected to the second bit line;

a memory cell array, connected to the bit lines, and containing memory cells;

a first reference cell, connected to the first bit line and the third bit line, including a cell which is formed of substantially the same area, capacity and structure as the memory cells of the memory cell array, and providing a first reference potential at a time of reading out data from the memory cells in the memory cell array; and a second reference cell, connected to the second bit line and the fourth bit line, including a cell which is formed of substantially the same area, capacity and structure as the memory cells of the memory cell array, and providing a second reference potential at a time of reading out data from the memory cells in the memory cell array.

2. The semiconductor memory device according to claim 1, wherein said first and second reference cells are of a non-volatile type.

3. The semiconductor memory device according to claim 1, wherein each of said first and second reference cells includes a ferroelectric cell.

4. The semiconductor memory device according to claim 3, wherein an electric field applied to said ferroelectric cell results in a hysteresis relationship.

5. The semiconductor memory device according to claim 1, wherein said first and second reference cells include switching transistor components.

6. The semiconductor memory device according to claim 5, wherein said first and second reference cells include only one transistor component.

7. The semiconductor memory device according to claim 5, wherein said memory cell array is of a non-volatile type.

8. The semiconductor memory device according to claim 5, wherein said memory cell array includes ferroelectric cells.

9. The semiconductor memory device according to claim 5, further comprising:

a dummy word line level generating circuit for supplying dummy word line drive signals to gates of said switching transistors.

10. The semiconductor memory device according to claim 9, wherein said dummy word line drive signals cause said reference cells to apply a reference potential to the bit lines before data is read out from said memory cell array.

11. The semiconductor memory device according to claim 10, wherein said memory cell array is constructed with ferroelectric cells.

12. The semiconductor memory device according to claim 9, wherein said memory cell array is constructed with ferroelectric cells.

13. The semiconductor memory device according to claim 1, further comprising:

reset switching transistors, connected to the bit lines, to clear data in the memory cell array, simultaneously.

14. The semiconductor memory device according to claim 13, wherein the reset switching transistors are connected to a predetermined potential terminal.

15. The semiconductor memory device according to claim 14, wherein said memory cell array is constructed with ferroelectric cells.

16. The semiconductor memory device according to claim 1, further comprising:

sense amplifiers connected, to said memory cell array, to detect data in said memory cell array.

17. The semiconductor memory device according to claim 16, wherein said memory cell array is constructed with ferroelectric cells.

* * * * *